(12) United States Patent
Yang et al.

(10) Patent No.: US 9,564,910 B2
(45) Date of Patent: Feb. 7, 2017

(54) CLOCK GENERATION CIRCUIT AND METHOD THEREOF

(71) Applicant: REALTEK SEMICONDUCTOR CORPORATION, Hsinchu (TW)

(72) Inventors: Chih-Yuan Yang, New Taipei (TW); Cheng-Hua Wu, Keelung (TW); Wen-Hsia Kung, Taoyuan County (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/698,468

(22) Filed: Apr. 28, 2015

(65) Prior Publication Data

US 2015/0318858 A1   Nov. 5, 2015

(30) Foreign Application Priority Data

May 5, 2014   (TW) .............................. 103116002 A

(51) Int. Cl.
| | |
|---|---|
| *H03L 7/06* | (2006.01) |
| *H03L 7/197* | (2006.01) |
| *H03L 7/081* | (2006.01) |
| *H03L 1/02* | (2006.01) |

(52) U.S. Cl.
CPC .............. *H03L 7/197* (2013.01); *H03L 1/027* (2013.01); *H03L 7/081* (2013.01); *H03L 7/1974* (2013.01)

(58) Field of Classification Search
USPC .................................. 327/147–149, 156–158
See application file for complete search history.

(56) References Cited

U.S. PATENT DOCUMENTS

| | | |
|---|---|---|
| 7,009,444 B1 | 3/2006 | Scott |
| 7,525,392 B2 | 4/2009 | Tarng |
| 2007/0263122 A1* | 11/2007 | Araki ..................... G09G 5/008 348/536 |
| 2008/0007508 A1* | 1/2008 | Yoneyama ............ G09G 5/005 345/100 |

(Continued)

OTHER PUBLICATIONS

Office Action from the counterpart Taiwan application 103116002 dated Feb. 3, 2016.

(Continued)

*Primary Examiner* — Adam Houston
(74) *Attorney, Agent, or Firm* — WPAT, P.C., Intellectual Property Attorneys; Anthony King

(57) ABSTRACT

This invention discloses a clock generation circuit and a clock generation method for generating a clock. The clock generation circuit includes a reference clock generation circuit, which is installed in a chip for independently generating a reference clock; a temperature sensor for sensing an ambient temperature to generate temperature information; a temperature compensation module, coupled to the temperature sensor, for generating a temperature compensation coefficient according to the temperature information; and a clock adjusting circuit, coupled to the clock generation circuit, for generating the clock according to the reference clock and the temperature compensation coefficient. The temperature compensation module generates the temperature compensation coefficient dynamically such that the frequency of the clock approaches a target frequency and does not substantially vary with the temperature.

17 Claims, 9 Drawing Sheets

(56) References Cited

U.S. PATENT DOCUMENTS

| | | | | |
|---|---|---|---|---|
| 2008/0192804 A1* | 8/2008 | Ryu | G01K 7/015 | 374/178 |
| 2012/0161826 A1* | 6/2012 | Aas | H03L 7/16 | 327/147 |
| 2013/0154698 A1* | 6/2013 | Bottelli | H03L 7/07 | 327/157 |
| 2013/0239695 A1* | 9/2013 | Tai | G05F 3/30 | 73/766 |
| 2015/0002130 A1* | 1/2015 | Kumar | G05F 3/30 | 323/313 |
| 2015/0116882 A1* | 4/2015 | Bowers | H01L 27/0259 | 361/103 |
| 2015/0117495 A1* | 4/2015 | Tiruvuru | G01K 7/006 | 374/178 |
| 2015/0180485 A1* | 6/2015 | Shanan | H03L 7/099 | 327/156 |
| 2015/0180486 A1* | 6/2015 | Shanan | H03L 7/099 | 327/156 |
| 2015/0222469 A1* | 8/2015 | Onishi | H04B 1/10 | 375/376 |
| 2015/0263741 A1* | 9/2015 | Li | H03B 1/00 | 327/156 |
| 2015/0318858 A1* | 11/2015 | Yang | H03L 7/1974 | 327/156 |
| 2016/0026198 A1* | 1/2016 | Eberlein | G05F 1/575 | 323/313 |
| 2016/0036453 A1* | 2/2016 | Frank | H03L 1/023 | 327/156 |
| 2016/0036454 A1* | 2/2016 | Moehlmann | H03L 7/0994 | 327/147 |
| 2016/0036485 A1* | 2/2016 | Nagaso | H03L 7/183 | 455/76 |

OTHER PUBLICATIONS

Search report from the counterpart Taiwan application 103116002 dated Feb. 3, 2016.

English abstract translation of the Office Action from the counterpart Taiwan application 103116002 dated Feb. 3, 2016.

* cited by examiner

CLOCK GENERATION CIRCUIT AND METHOD THEREOF

BACKGROUND OF THE INVENTION

1. Field of the Invention

The present invention relates to a clock generation circuit and the method thereof, especially to a clock generation circuit and the method thereof that utilize a reference clock inside a chip to generate an accurate clock.

2. Description of Related Art

Please refer to FIG. 1, illustrating a functional block diagram of a conventional image processing module. The image processing module comprises a circuit board 100. An image processing chip 110, which is mounted on the circuit board 100, comprises a clock adjusting circuit 112 and a micro controller 114. In addition to the image processing chip 110, the circuit board 100 further comprises a crystal oscillator 120, a HDMI (High-Definition Multimedia Interface)/MHL (Mobile High-Definition Link) port 130, a DVI (Digital Visual Interface)/DP (DisplayPort) port 140, a VGA (Video Graphics Array) port 150, an EEPROM (electrically erasable programmable read only memory) 160, a USB (universal serial bus) control chip 170, an LVDS (Low-voltage differential signaling) port 180, and an LED (light emitting diode) module port 190. The image processing chip 110 receives image data in digital or analog format through the HDMI/MHL port 130, the DVI/DP port 140, or the VGA port 150, performs format conversion or scaling on the image data, and then outputs the processed image data to a display panel through the LVDS port 180 and controls an LED backlight of the display panel through the LED module port 190. The image processing chip 110 also accesses the EEPROM 160 and communicates with external USB devices, such as flash memories, through the USB control chip 170.

In the above processes, the micro controller 114 of the image processing chip 110 has to refer to a stable working clock to perform the tasks. For example, after the image processing chip 110 receives image signal through the HDMI/MHL port 130, the DVI/DP port 140 or the VGA port 150, preliminary data will be obtained through processes in the front-end, such as data sampling and decoding, and then image data that are ready for display will be obtained by performing subsequent processes, such as image interpolation, color correction, contrast enhancement, on the preliminary data. Further, the image processing chip 110 stabilizes the image data by using a FIFO (first in first out) buffer when the image data is being outputted. Besides, if the image signal is an analog signal in VGA format, the micro controller 114 must further sample an Hsync (horizontal synchronization) signal and/or a Vsync (vertical synchronization) signal of the image signal to determine a mode of the image signal. Therefore, a reference clock is required for the image processing chip 110 to complete the above tasks. Conventionally, a crystal oscillator 120, which is not affected by a manufacturing process of the chip and an operating temperature, is installed on the circuit board 100 to provide a rather accurate reference clock. As shown in FIG. 1, the reference clock generated by the crystal oscillator 120 is inputted to the image processing chip 110; then the frequency and the phase of the reference clock are adjusted by the clock adjusting circuit 112 to form a working clock with a frequency required by the micro controller 114. In general, the clock adjusting circuit 112 can be implemented by an integer-N PLL (phase-locked loop) or a fractional-N PLL, depending on a ratio between the frequencies of the working clock and the reference clock.

However, the crystal oscillator 120 not only increases the area of the circuit board 100, but increases the winding length. The longer the winding length is, the easier the circuit board 100 and the components thereon are affected by electromagnetic interference. In addition, the crystal oscillator 120 also increase the overall cost of an image processing module. If the crystal oscillator 120 can be saved in each module, a great deal of cost can be saved when then quantity is huge. As a result, approaches of replacing the crystal oscillator outside the chip with a built-in reference clock generation circuit inside the chip are proposed. Please refer to FIG. 2, illustrating a functional block diagram of implementing a reference clock generation circuit inside a chip. The chip 200 in FIG. 2 comprises a reference clock generation circuit 210, a clock adjusting circuit 220, and a micro controller 230. Similar to the image processing chip 110, inside the chip 200 the phase and the frequency of the reference clock are adjusted by the clock adjusting circuit 220 to generate the working clock required by the micro controller 230; however, the chip 200 has the reference clock generation circuit 210 to provide the reference clock. In practical, the reference clock generation circuit 210 can be implemented by the LC tanks shown in FIGS. 3 and 4. The LC tanks in FIGS. 3 and 4 comprise inductors 310 and 320, capacitors 330 and 340, and transistors 350 and 360, and the LC tank in FIG. 4 further comprises a transistor 370. The principles of the LC tank are well known to people having ordinary skill in the art. Unfortunately, the LC tanks are subject to frequency drift due to temperature variations. The LC tank experiences a rising temperature in its environment as the working time of the chip 200 increases, which causes the frequency of the reference clock to decrease. As a result, the frequency of the working clock decreases as well, which causes the system to encounter errors. For example, if the chip 200 is an image processing chip, the error may cause mistakes in output images or even result in blank images.

SUMMARY OF THE INVENTION

In consideration of the imperfections of the prior art, an object of the present invention is to provide a clock generation circuit and its related method, so as to make an improvement to the prior art.

The present invention discloses a clock generation circuit for generating a clock. The clock generation circuit comprises a reference clock generation circuit, which is installed in a chip for independently generating a reference clock; a temperature sensor for sensing an ambient temperature to generate temperature information; a temperature compensation module, coupled to the temperature sensor, for generating a temperature compensation coefficient according to the temperature information; and a clock adjusting circuit, coupled to the reference clock generation circuit, for generating the clock according to the reference clock and the temperature compensation coefficient. The temperature compensation module generates the temperature compensation coefficient dynamically so that a frequency of the clock approaches a target frequency and does not substantially vary with the temperature.

The present invention also discloses a clock generation method for generating a clock. The method comprises steps of: generating a reference clock independently inside a chip; sensing an ambient temperature to generate temperature information; generating a temperature compensation coefficient according to the temperature information; and generating the clock according to the reference clock and the temperature compensation coefficient. The temperature compensation coefficient is generated dynamically so that a frequency of the clock approaches a target frequency and does not substantially vary with the temperature.

The clock generation circuit and its related method of this invention utilize a built-in reference clock generation circuit to generate a reference clock; thus an external reference clock source, e.g., a crystal oscillator, is not required, which not only reduces the cost but decreases the area of the circuit board and the winding length. Further, in comparison to the prior art, the clock generation circuit and its related method of this invention also provide a temperature compensation mechanism, which makes a frequency of the working clock maintain a target value to stabilize the circuits in the chip as the temperature inside the chip rises due to long working time of the chip.

These and other objectives of the present invention will no doubt become obvious to those of ordinary skill in the art after reading the following detailed description of the embodiments that are illustrated in the various figures and drawings.

DETAILED DESCRIPTION OF THE EMBODIMENTS

The following description is written by referring to terms of this invention field. If any term is defined in the specification, such term should be explained accordingly. Besides, the connection between objects or events in the following embodiments can be direct or indirect provided that these embodiments are still applicable under such connection. Said "indirect" means that an intermediate object or a physical space exists between the objects, or an intermediate event or a time interval exists between the events. The present invention discloses a clock generation circuit and its related method, and the detail known in this field will be omitted if such detail has little to do with the features of the present invention. People of ordinary skill in the art can choose components or steps equivalent to those described in this specification to carry out the present invention, which means that the scope of this invention is not limited to the embodiments in the specification. On account of that some or all elements of said device invention could be known, the detail of such elements will be omitted provided that this omission nowhere dissatisfies the specification and enablement requirements. Besides, said method invention can be in the form of firmware and/or software which could be carried out by the device of this invention or the equivalent thereof; hence, the following description on the method invention will focus on the processes and steps instead of the hardware without dissatisfying the specification and enablement requirements.

Figure 1:
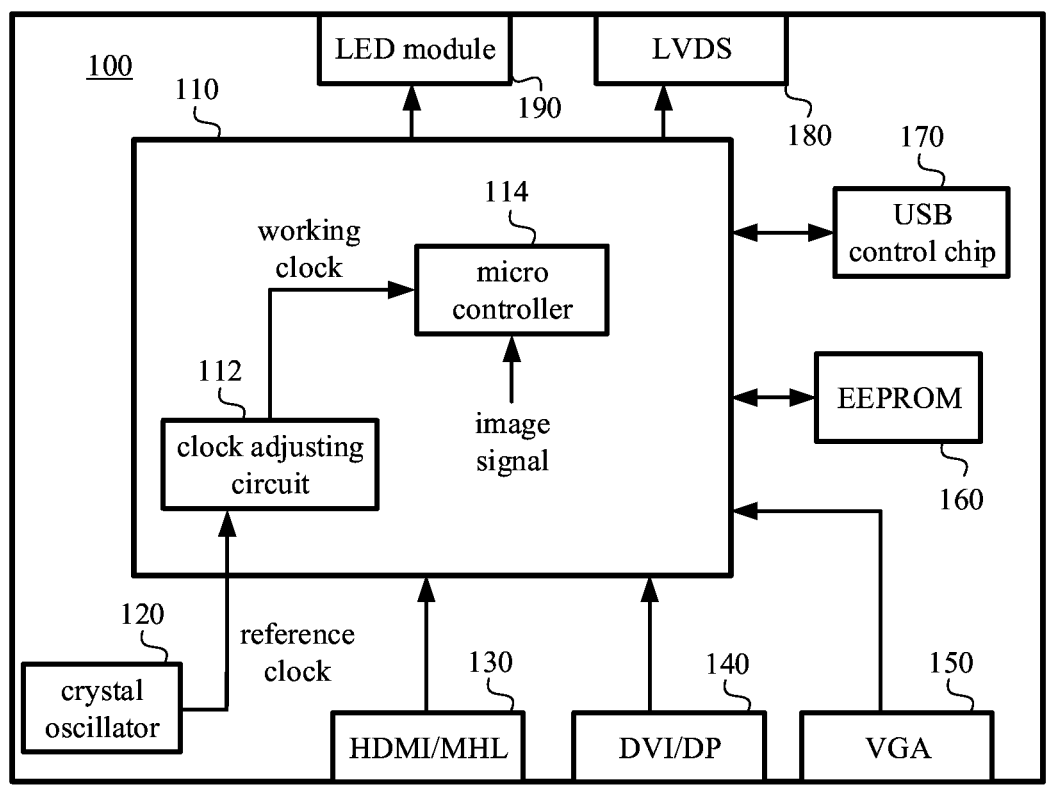
FIG. 1 illustrates a functional block diagram of a conventional image processing module.
Figure 2:
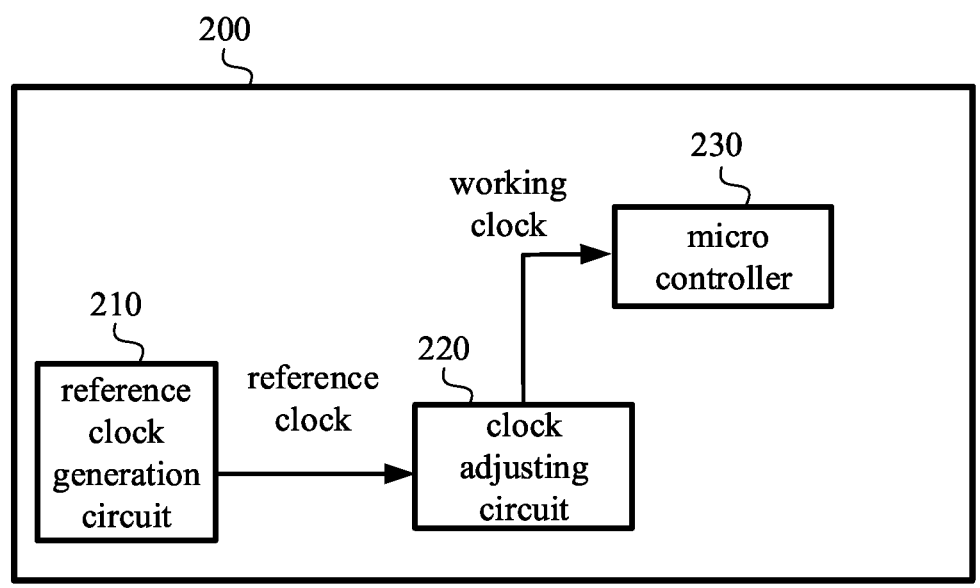
FIG. 2 illustrates a functional block diagram of implementing a reference clock generation circuit inside a chip.
Figure 3:
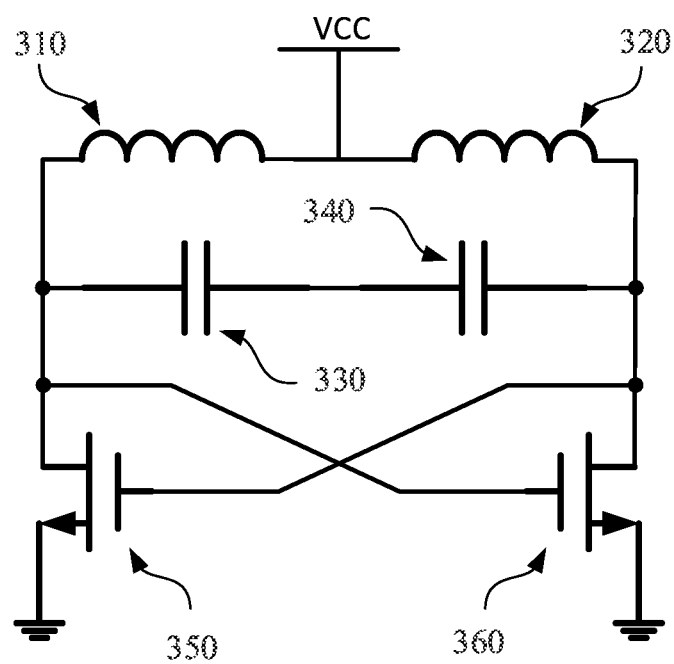
FIG. 3 illustrates a circuit diagram of an LC tank.
Figure 4:
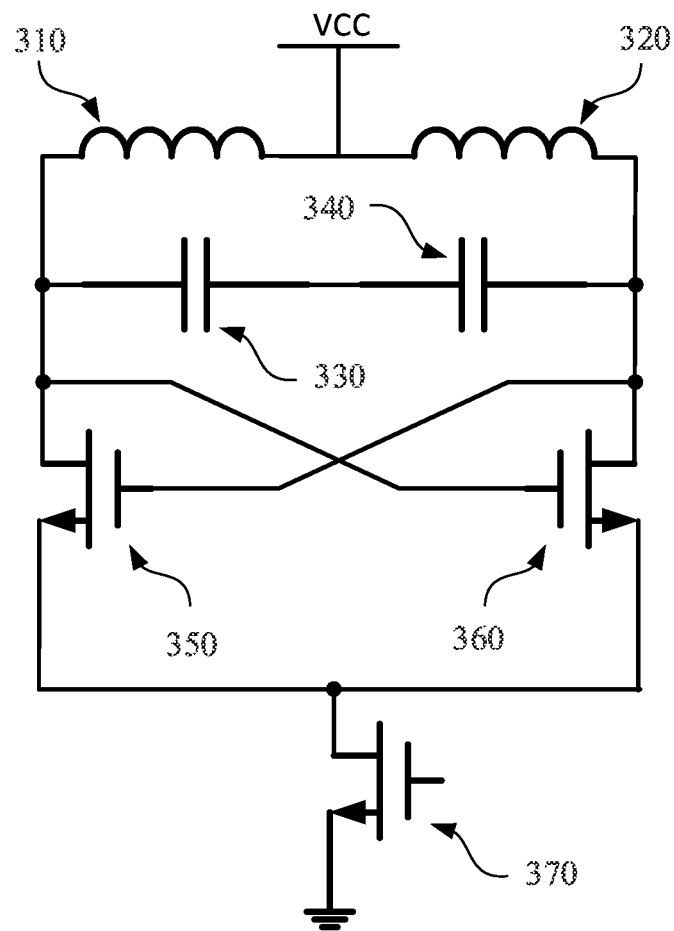
FIG. 4 illustrates another circuit diagram of an LC tank.
Figure 5:
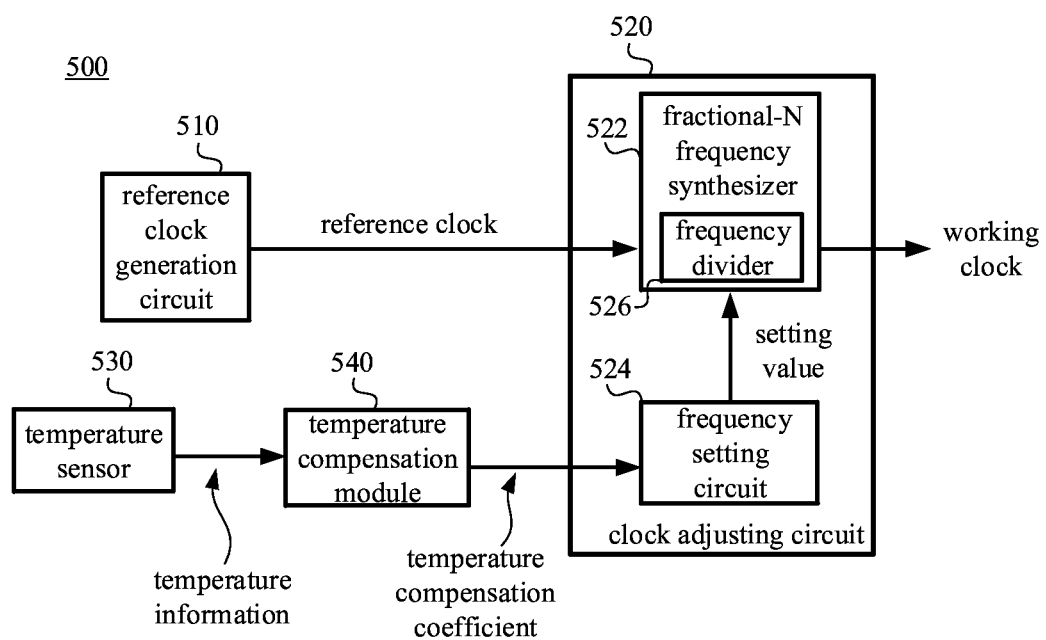
FIG. 5 illustrates a functional block diagram of a clock generation circuit according to an embodiment of the present invention.
Figure 6:
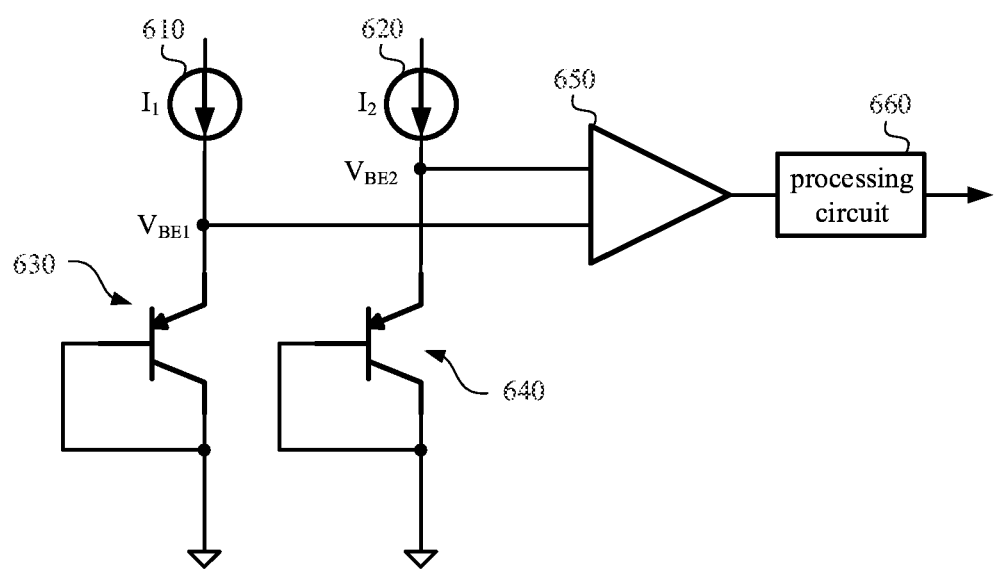
FIG. 6 illustrates a circuit diagram of a temperature sensor.

Please refer to FIG. 5, illustrating a functional block diagram of a clock generation circuit according to an embodiment of the present invention. A clock generation circuit 500 comprises a reference clock generation circuit 510, a clock adjusting circuit 520, a temperature sensor 530, and a temperature compensation module 540. The reference clock generation circuit 510 generates a reference clock and can be implemented by the LC tanks shown in FIGS. 3 and 4. The reference clock generation circuit 510 does not need any incoming clock. In other words, the reference clock generation circuit 510 generates the reference clock independently. Besides, the reference clock generation circuit 510 is installed inside the chip. There is no crystal oscillator generating outside reference clock to the reference clock generation circuit 510. The temperature sensor 530 senses the ambient temperature and generates temperature information. An embodiment of the temperature sensor 530 is shown in FIG. 6. The bases and collectors of the BJTs (bipolar junction transistors) 630 and 640 are coupled to a reference level and theirs emitters are respectively coupled to a current source 610, which provides a current $I_1$, and a current source 620, which provides a current $I_2$. The emitter areas of the BJT 630 and the BJT 640 are $A_1$ and $A_2$ respectively. According to the basic characteristics of a BJT, the following equations can be derived:

$$V_{BE1} = \frac{kT}{q}\ln\left(\frac{I_1}{A_1 I_s}\right) \tag{1}$$

$$V_{BE2} = \frac{kT}{q}\ln\left(\frac{I_2}{A_2 I_s}\right) \tag{2}$$

where, k is the Boltzmann constant, T is the absolute temperature, q is the charge quantity, $I_s$ is the reverse saturation current of the BJT. Subtracting equation (2) from equation (1) obtains:

$$V_{BE1} - V_{BE2} = \frac{kT}{q}\ln\left(\frac{I_1 A_2}{I_2 A_1}\right) \tag{3}$$

Assuming that $I_1=I_2$ and $A_2/A_1=r$, then $$V_{BE1} - V_{BE2} = \frac{kT}{q}\ln(r) \tag{4}$$

In conclusion, the absolute temperature T is proportional to $(V_{BE1}-V_{BE2})$. The two input terminals of a comparator 650, such as a differential amplifier, are respectively coupled to the emitters of the BJT 630 and the BJT 640. A processing circuit 660 converts the voltage difference $(V_{BE1}-V_{BE2})$, which is calculated by the comparator 650, into digital domain, and then conducts a decimal filtering process and transformation in digital domain to generate the temperature information.

Figure 7:
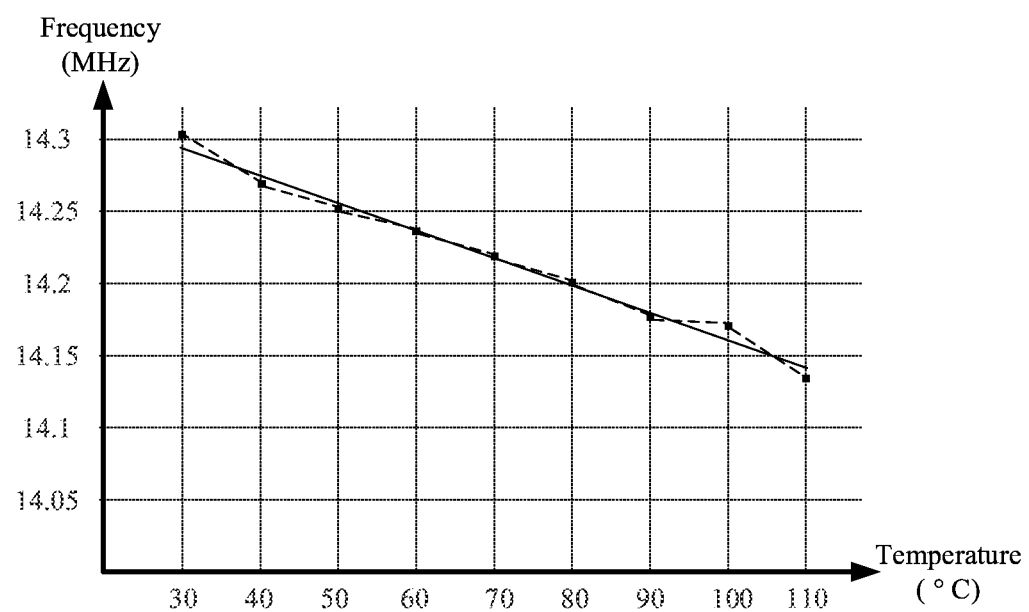
FIG. 7 illustrates a frequency-temperature relationship of the working clock.

Please refer to FIG. 5 again. The temperature compensation module 540 generates a temperature compensation coefficient according to the temperature information. The clock adjusting circuit 520 comprises a fractional-N frequency synthesizer 522 and a frequency setting circuit 524. The fractional-N frequency synthesizer 522 can be implemented by a fractional-N PLL (phase lock loop), which receives the reference clock and set a frequency divider 526 according to a setting value N·F (N being the integer part, F being the fractional part); therefore, the frequency of the working clock is N·F times that of the reference clock. Further, to achieve temperature compensation, the setting value generated by the frequency setting circuit 524 must relate to the temperature information, so the temperature compensation module 540 is required to convert the temperature information to the temperature compensation coefficient according to a certain compensation mechanism. Then the frequency setting circuit 524 adjusts the setting value according to the temperature compensation coefficient to achieve temperature compensation. How the temperature compensation module 540 generates the temperature compensation coefficient according to the temperature information will be described below. In fact, the frequency of the reference clock generated by the reference clock generation circuit 510 varies with the temperature, which causes the frequency of the working clock to vary with the temperature accordingly. The relationship between the frequency and the temperature can be found by measuring the frequency of the working clock at different ambient temperatures. Please refer to FIG. 7, illustrating a frequency-temperature relationship of the working clock. As shown in FIG. 7, assuming that the ideal frequency of the working clock is 14.318 MHz, in the beginning, the setting value is adjusted to make the frequency of the working clock very close to the ideal frequency at 30° C. The setting value at the time is considered a reference value. Afterwards, the ambient temperature is gradually increased and the frequency of the working clock is recorded every predetermined temperature interval, e.g., 10° C. Consequently, a frequency-temperature relationship similar to FIG. 7 will be obtained. The frequency of the working clock decreases as the temperature increases, and the relationship between the frequency and the temperature can be approximated by the solid line in FIG. 7. According to the characteristics of a PLL, a relationship among the frequency ($f_{work}$) of the working clock, the frequency ($f_{ref}$) of the reference clock, and the setting value (N·F) can be described as $$f_{work} = f_{ref} \times N \cdot F \quad (5)$$

As a result, a decrease in the frequency of the working clock, caused by a decrease in the frequency of the reference clock as the temperature increases, can be compensated by increasing the setting value N·F to make the frequency of the working clock as close to the ideal frequency as possible.

Figure 8:
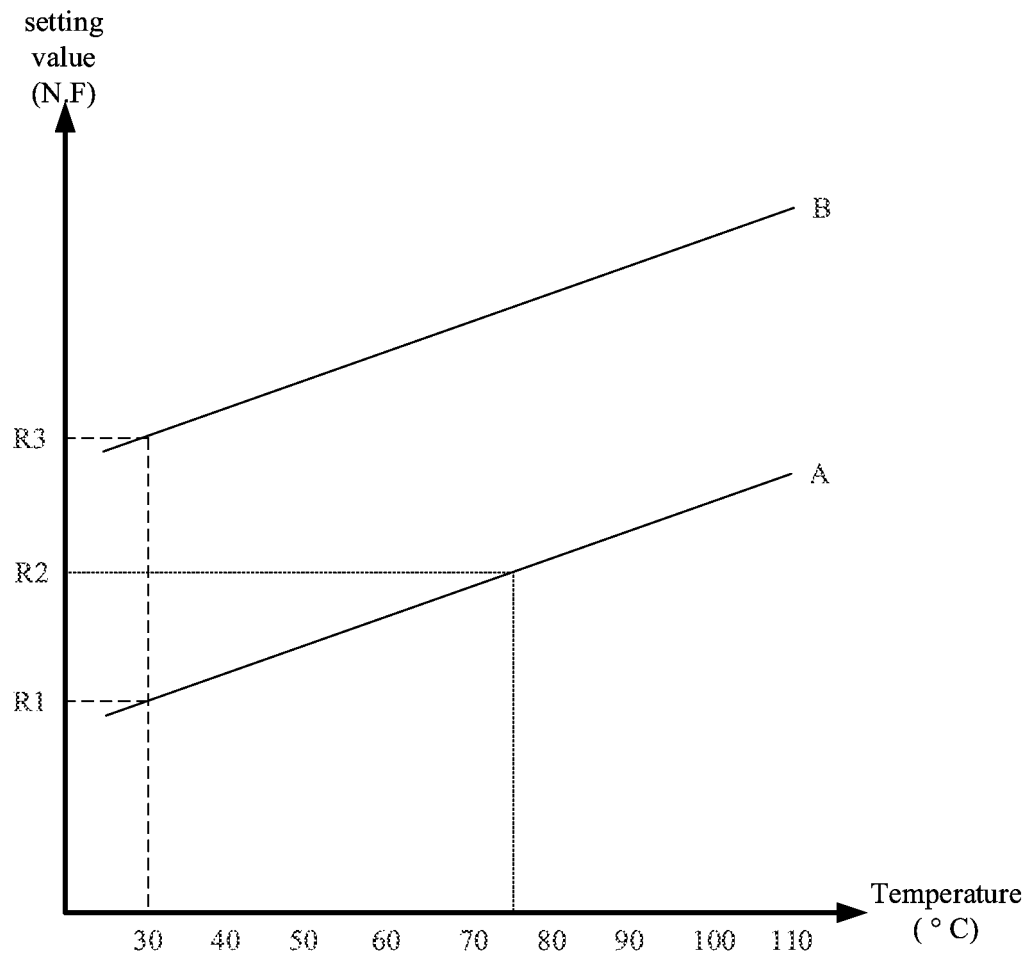
FIG. 8 illustrates a relationship between a setting value of a frequency setting circuit and a temperature.

Please refer to FIG. 8, illustrating a relationship between a setting value of a frequency setting circuit and a temperature. Because the slope of the solid approximation line in FIG. 7 is negative, the compensation is made according to an opposite (i.e., a negative version) of the slope; as a result, the variation in frequency with temperature can be compensated. In addition, a practical measurement shows that for different reference clock generation circuits 510 the variations in the frequency of the reference clock with temperature are quite similar. In other words, the slopes of the approximation lines in FIG. 7 for different reference clock generation circuits 510 are quite similar. The compensation curve A and the compensation curve B in FIG. 8 correspond to different chips but have the same slope, which is an opposite of the slope of the approximation line in the frequency-temperature relationship. In this embodiment, the slope of the approximation line is negative for the frequency decreases as the temperature increases, so a slope of the corresponding compensation curve is positive; in other embodiments, however, the frequency may increases as the temperature increases, resulting in an approximation line with a positive slope, and thus a slope of the corresponding compensation curve is negative. The setting values N·F at 30° C. of the compensation curve A and the compensation curve B are R1 and R3 respectively and are referred to as the aforementioned reference values. The temperature compensation module 540 generates the temperature compensation coefficients corresponding to each temperature according to the reference value and the slope. For example, the setting value N·F at 75° C. for the compensation curve A, which is R2, can be obtained by interpolation and the temperature compensation coefficient can then be obtained. The reference value R1 of the compensation curve A is different from the reference value R3 of the compensation curve B because the manufacturing process varies, which results in a slight difference in each reference clock generation circuit 510. However, the temperature compensation module 540 can calculate the temperature compensation coefficient corresponding to the compensation curve B as long as an offset between the compensation curve A and the compensation curve B, i.e., R3-R1, is known in advance.

In summary, the temperature compensation module 540 is able to generate the temperature compensation coefficient according to the slope and the reference value in FIG. 8. In this embodiment, the temperature compensation module 540 increases the temperature compensation coefficient as the temperature increases so that the setting value N·F outputted by the frequency setting circuit 524 also increases over an increasing temperature. In one embodiment, the temperature compensation module 540 is implemented by firmware, which generates the temperature compensation coefficient every predetermined period (e.g., 10 ms) according to the temperature information, the slope of the compensation curve and the reference value; in another embodiment, the temperature compensation module 540 is implemented by hardware, which may simply utilize a linear passive component, such as a resistor, to represent the slope since the slope of the compensation curve is also linear. The advantage of hardware implementation is that the temperature compensation coefficient can reflect a change in the temperature information in real-time; on the other hand, the advantage of firmware implementation is having design flexibility for the slope and the offset of the compensation curve can be easily modified.

Figure 9:
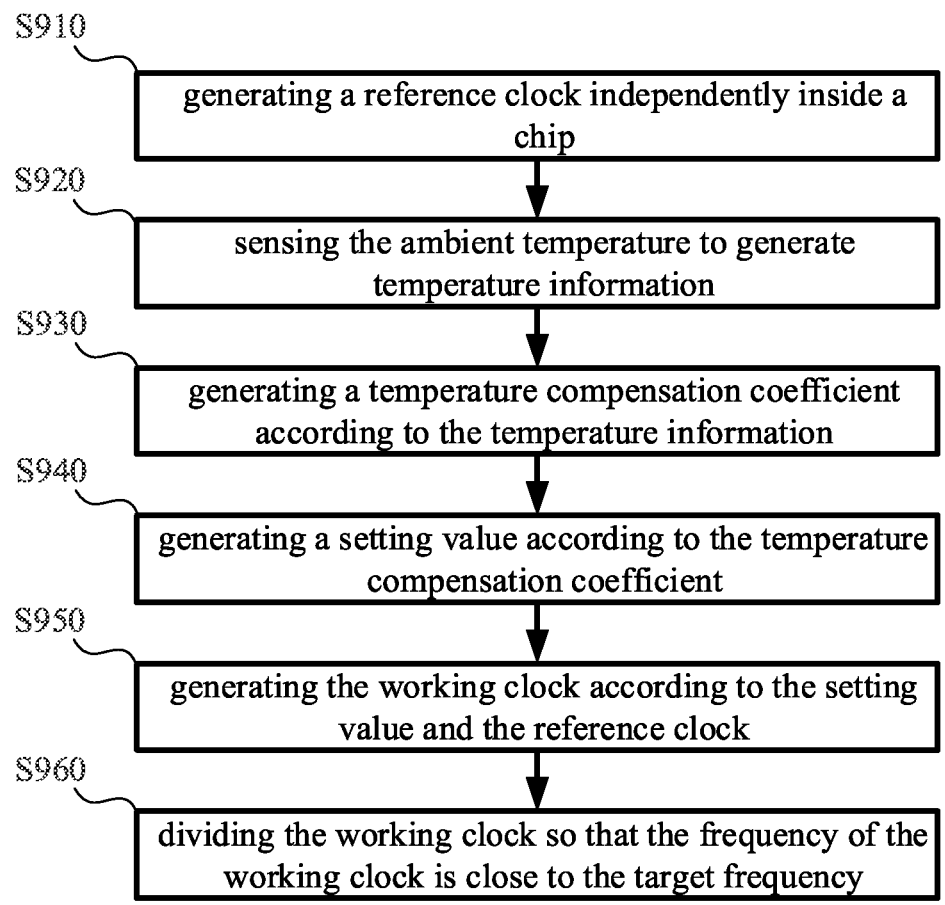
FIG. 9 illustrates a flowchart of a clock generation method according to an embodiment of the present invention.

Please refer to FIG. 9, illustrating a flowchart of a clock generation method according to an embodiment of the present invention. In addition to the clock generation circuit, this invention also discloses a corresponding clock generation method that saves a reference clock generation source outside a chip on a circuit board. This method can be applied to an image processing chip. The method is performed by the clock generation circuit 500 or its equivalent circuits. As shown in FIG. 9, the clock generation method according to an embodiment of this invention comprises the following steps:

Step S910: generating a reference clock independently inside a chip. A clock generation circuit, such as an LC tank, is provided inside a chip to independently generate a reference clock. In brief, there is no need to receive or refer to any incoming clock as the reference clock is being generated;

Step S920: sensing the ambient temperature to generate temperature information. A temperature sensor is provided inside a chip to sense the temperature of the chip and therefore the temperature information is generated;

Step S930: generating a temperature compensation coefficient according to the temperature information. A frequency of a working clock that is generated according to a reference clock varies with the temperature as a frequency of the reference clock varies with the temperature. To make the frequency of the working clock be as close to a target frequency as possible, compensation must be made according to a variation in the frequency of the working clock with the temperature. In this embodiment, a frequency-temperature relationship of the working clock is shown as FIG. 7. The frequency of the working clock decreases as the temperature increases and the relationship is linear. Therefore, a temperature compensation curve varies with the temperature in an opposite way, i.e., the temperature compensation coefficient increases as the temperature increases. To be more specific, as shown in FIG. 8, a slope of the temperature compensation curve is an opposite of the slope of the solid approximation line in FIG. 7. As a result, the temperature compensation coefficient can be generated according to the slope of the temperature compensation curve, the reference value and the temperature information. In practical, the temperature compensation coefficient can be generated by firmware or hardware. The implementation details and the pros and cons of each method are disclosed in the description of the corresponding device embodiment, and are therefore omitted for brevity;

Step S940: generating a setting value according to the temperature compensation coefficient. As illustrated by equation (5), the setting value is a ratio of the frequency of the working clock to that of the reference clock. When the frequency of the reference clock decreases as the temperature increases, the setting value must be increased to make the frequency of the working clock close to the target frequency. This step adjusts the setting value according to the temperature compensation coefficient generated in the previous step. In this illustrative embodiment, a relationship between the setting value and the temperature is shown in FIG. 8. Because the relationship between the frequency of the working clock and the temperature is linear, as shown in FIG. 7, the relationship between the setting value and the temperature is also linear; Step S950: generating the working clock according to the setting value and the reference clock. The working clock is generated according to equation (5). A ratio of the frequency of the working clock to the frequency of the reference clock is equal to the setting value; and Step S960: dividing the working clock so that the frequency of the working clock is close to the target frequency. Sometimes the frequency of the working clock is too high to be used as the target frequency required in a practical application, so the frequency of the working clock is divided to make it closer to the target frequency.

The clock generation circuit and the clock generation method of this invention can be applied to an image processing chip such as an image processing chip that processes VGA signals. A standard of video graphics array comprises a plurality of display modes. The frequencies of horizontal/vertical synchronization signals and resolution in each mode are different. One task of the image processing chip is to determine the mode of an input signal; to be more specific, the chip analyzes the horizontal/vertical synchronization signals according to the working clock to determine the mode. According to the VGA standard, the highest frequency of the horizontal/vertical synchronization signals among all modes is not greater than 100 KHz, and the tolerance to frequency offset of the highest frequency is 1%, i.e., 10000 ppm. Besides, the lower the frequency is, the higher the tolerance becomes. Therefore, as long as the frequency offset of the working clock is less than 1%, all modes of VGA signals can then be accurately determined. A practical operation of the clock generation circuit of this invention shows that the frequency offset of the working clock is about 2000 ppm, which is less than 10000 ppm. In other words, a VGA image processing chip that utilizes the clock generation circuit and the clock generation method of this invention is able to determine the mode of an image signal. In addition, the clock generation circuit and the clock generation method of this invention have a temperature compensation capability that facilitates an image processing chip which carries out this invention to work properly in a wide range of temperatures.

Since people of ordinary skill in the art can appreciate the implementation detail and the modification thereto of the present method invention of FIG. 9 through the disclosure of the device invention of FIGS. 5 to 8, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention. Besides, each aforementioned embodiment may include one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The aforementioned descriptions represent merely the embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A clock generation circuit for generating a clock comprising:
    a reference clock generation circuit, which is installed in a chip for independently generating a reference clock;
    a temperature sensor for sensing an ambient temperature to generate temperature information;
    a temperature compensation module, coupled to the temperature sensor, for generating a temperature compensation coefficient according to the temperature information; and
    a clock adjusting circuit, coupled to the reference clock generation circuit, for generating the clock according to the reference clock and the temperature compensation coefficient;
    wherein, the temperature compensation module generates the temperature compensation coefficient dynamically so that a frequency of the clock approaches a target frequency and does not substantially vary with the temperature.

2. The clock generation circuit of claim 1, wherein a variation in the frequency of the reference clock with temperature shows a linear relationship and the temperature compensation module generates the temperature compensation coefficient according to the linear relationship.

3. The clock generation circuit of claim 2, wherein the temperature compensation module is implemented by firmware and calculates the temperature compensation coefficient every predetermined period according to the temperature information and the linear relationship.

4. The clock generation circuit of claim 2, wherein the temperature compensation module is implemented by hardware and updates the temperature compensation coefficient in real-time according to the temperature information and the linear relationship.

5. The clock generation circuit of claim 1, wherein the clock adjusting circuit comprises:
    a setting circuit, coupled to the temperature compensation module, for generating a setting value according to the temperature compensation coefficient; and
    a frequency synthesizer, coupled to the reference clock generation circuit and the setting circuit, for generating the clock according to the setting value and the reference clock.

6. The clock generation circuit of claim 5, wherein the temperature compensation module further refers to a reference value to generate the temperature compensation coefficient, and the reference value corresponds to the setting value at a predetermined temperature when the frequency of the clock is substantially identical to the target frequency.

7. The clock generation circuit of claim 5, wherein the frequency synthesizer further comprises:
    a frequency divider, for dividing the frequency of the clock according to the setting value such that a ratio of the frequency of the clock to the frequency of the reference clock corresponds to the setting value.

8. The clock generation circuit of claim 1, wherein the temperature sensor comprises:
    a first BJT, having its emitter coupled to a first current source and its base and collector coupled to a reference level;
    a second BJT, having its emitter coupled to a second current source and its base and collector coupled to the reference level; and
    a comparator, having one input coupled to the emitter of the first BJT and the other input coupled to the emitter of the second BJT, and its output outputting a comparison value; and
    a processing circuit, coupled to the comparator, for converting the comparison value to the temperature information.

9. The clock generation circuit of claim 1 being applied to an image processing chip, which processes a VGA signal according to the clock to determine a display mode of the VGA signal.

10. A clock generation method for generating a clock comprising:
    generating a reference clock independently inside a chip;
    sensing an ambient temperature to generate temperature information;
    generating a temperature compensation coefficient according to the temperature information; and
    generating the clock according to the reference clock and the temperature compensation coefficient;
    wherein, the temperature compensation coefficient is generated dynamically so that a frequency of the clock approaches a target frequency and does not substantially vary with the temperature.

11. The clock generation method of claim 10, wherein a variation in the frequency of the reference clock with temperature shows a linear relationship and the step of generating the temperature compensation coefficient according to the temperature information generates the temperature compensation coefficient according to the linear relationship.

12. The clock generation method of claim 11, wherein the step of generating the temperature compensation coefficient according to the temperature information calculates the temperature compensation coefficient every predetermined period according to the temperature information and the linear relationship.

13. The clock generation method of claim 11, wherein the step of generating the temperature compensation coefficient according to the temperature information updates the temperature compensation coefficient in real-time according to the temperature information and the linear relationship.

14. The clock generation method of claim 10, wherein the step of generating the clock according to the reference clock and the temperature compensation coefficient comprises:
    generating a setting value according to the temperature compensation coefficient; and
    generating the clock according to the setting value and the reference clock.

15. The clock generation method of claim 14, wherein the step of generating the temperature compensation coefficient according to the temperature information further refers to a reference value to generate the temperature compensation coefficient and the reference value corresponds to the setting value at a predetermined temperature when the frequency of the clock is substantially identical to the target frequency.

16. The clock generation method of claim 10, further comprising:
    dividing the frequency of the clock such that the frequency of the clock approaches the target frequency.

17. The clock generation method of claim 10 being applied to an image processing chip, which processes a VGA signal according to the clock to determine a display mode of the VGA signal.

* * * * *